(12) United States Patent
Chou et al.

(10) Patent No.: US 7,547,568 B2
(45) Date of Patent: Jun. 16, 2009

(54) ELECTRICAL CONDITIONING OF MEMS DEVICE AND INSULATING LAYER THEREOF

(75) Inventors: Chen-Jean Chou, New York, NY (US); Chun-chen Wu, Hsinfeng (CN); Patrick F. Brinkley, San Mateo, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 488 days.

(21) Appl. No.: 11/360,131

(22) Filed: Feb. 22, 2006

(65) Prior Publication Data

US 2007/0196944 A1    Aug. 23, 2007

(51) Int. Cl.
*H01L 21/00* (2006.01)

(52) U.S. Cl. .............................. 438/48; 438/50; 438/51; 438/53; 257/E21.001

(58) Field of Classification Search .................. 438/48, 438/50, 51, 53; 257/E21.001
See application file for complete search history.

(56) References Cited

U.S. PATENT DOCUMENTS

| | | | |
|---|---|---|---|
| 2,534,846 A | 12/1950 | Ambrose et al. | |
| 3,439,973 A | 4/1969 | Paul et al. | |
| 3,443,854 A | 5/1969 | Weiss | |
| 3,616,312 A | 10/1971 | McGriff et al. | |
| 3,653,741 A | 4/1972 | Marks | |
| 3,656,836 A | 4/1972 | de Cremoux et al. | |
| 3,725,868 A | 4/1973 | Malmer, Jr. et al. | |
| 3,813,265 A | 5/1974 | Marks | |
| 3,955,880 A | 5/1976 | Lierke | |
| 4,099,854 A | 7/1978 | Decker et al. | |
| 4,196,396 A | 4/1980 | Smith | |
| 4,228,437 A | 10/1980 | Shelton | |
| 4,377,324 A | 3/1983 | Durand et al. | |
| 4,389,096 A | 6/1983 | Hori et al. | |
| 4,392,711 A | 7/1983 | Moraw et al. | |
| 4,403,248 A | 9/1983 | te Velde | |
| 4,441,791 A | 4/1984 | Hornbeck | |
| 4,445,050 A | 4/1984 | Marks | |
| 4,459,182 A | 7/1984 | te Velde | |
| 4,482,213 A | 11/1984 | Piliavin et al. | |

(Continued)

FOREIGN PATENT DOCUMENTS

CH        681 047        12/1992

(Continued)

OTHER PUBLICATIONS

IPRP for PCT/US07/003267, filed Feb. 2, 2007.

(Continued)

*Primary Examiner*—Alexander G Ghyka
*Assistant Examiner*—Angel Roman
(74) *Attorney, Agent, or Firm*—Knobbe Martens Olson & Bear LLP

(57) ABSTRACT

A method of fabricating a MEMS device includes conditioning of an insulating layer by applying a voltage across the insulating layer via a conductive sacrificial layer for a period of time, prior to removal of the conductive sacrificial layer. This conditioning process may be used to saturate or stabilize charge accumulated within the insulating layer. The resistance across the insulating layer may also be measured to detect possible defects in the insulating layer.

20 Claims, 11 Drawing Sheets

U.S. PATENT DOCUMENTS

| | | |
|---|---|---|
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Katagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoades et al. |
| 5,619,366 A | 4/1997 | Rhoads et al. |
| 5,622,814 A | 4/1997 | Miyata et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |

| | | | | | | |
|---|---|---|---|---|---|---|
| 5,638,946 | A | 6/1997 | Zavracky | 6,295,154 B1 | 9/2001 | Laor et al. |
| 5,641,391 | A | 6/1997 | Hunter et al. | 6,297,072 B1 | 10/2001 | Tilmans et al. |
| 5,646,768 | A | 7/1997 | Kaeiyama | 6,323,982 B1 | 11/2001 | Hornbeck |
| 5,647,819 | A | 7/1997 | Fujita et al. | 6,327,071 B1 | 12/2001 | Kimura et al. |
| 5,650,834 | A | 7/1997 | Nakagawa et al. | 6,329,297 B1 | 12/2001 | Balish et al. |
| 5,650,881 | A | 7/1997 | Hornbeck | 6,335,831 B2 | 1/2002 | Kowarz et al. |
| 5,654,741 | A | 8/1997 | Sampsell et al. | 6,351,329 B1 | 2/2002 | Greywal |
| 5,657,099 | A | 8/1997 | Doherty et al. | 6,356,254 B1 | 3/2002 | Kimura |
| 5,659,374 | A | 8/1997 | Gale, Jr. et al. | 6,359,673 B1 | 3/2002 | Stephenson |
| 5,665,997 | A | 9/1997 | Weaver et al. | 6,376,787 B1 | 4/2002 | Martin et al. |
| 5,673,139 | A | 9/1997 | Johnson | 6,377,233 B2 | 4/2002 | Colgan et al. |
| 5,674,757 | A | 10/1997 | Kim | 6,391,675 B1 | 5/2002 | Ehmke et al. |
| 5,683,591 | A | 11/1997 | Offenberg | 6,392,233 B1 | 5/2002 | Channin et al. |
| 5,703,710 | A | 12/1997 | Brinkman et al. | 6,392,781 B1 | 5/2002 | Kim et al. |
| 5,706,022 | A | 1/1998 | Hato | 6,407,851 B1 | 6/2002 | Islam et al. |
| 5,710,656 | A | 1/1998 | Goosen | 6,447,126 B1 | 9/2002 | Hornbeck |
| 5,726,480 | A | 3/1998 | Pister | 6,448,622 B1 | 9/2002 | Franke et al. |
| 5,739,945 | A | 4/1998 | Tayebati | 6,452,465 B1 | 9/2002 | Brown et al. |
| 5,745,193 | A | 4/1998 | Urbanus et al. | 6,456,420 B1 | 9/2002 | Goodwin-Johansson |
| 5,745,281 | A | 4/1998 | Yi et al. | 6,465,355 B1 | 10/2002 | Horsley |
| 5,771,116 | A | 6/1998 | Miller et al. | 6,466,354 B1 | 10/2002 | Gudeman |
| 5,784,190 | A | 7/1998 | Worley | 6,466,358 B2 | 10/2002 | Tew |
| 5,784,212 | A | 7/1998 | Hornbeck | 6,473,274 B1 | 10/2002 | Maimone et al. |
| 5,793,504 | A | 8/1998 | Stoll | 6,480,177 B2 | 11/2002 | Doherty et al. |
| 5,808,780 | A | 9/1998 | McDonald | 6,496,122 B2 | 12/2002 | Sampsell |
| 5,818,095 | A | 10/1998 | Sampsell | 6,513,911 B1 | 2/2003 | Ozaki et al. |
| 5,822,110 | A | 10/1998 | Dabbaj | 6,522,801 B1 | 2/2003 | Aksyuk et al. |
| 5,822,170 | A | 10/1998 | Cabuz et al. | 6,531,945 B1 | 3/2003 | Ahn et al. |
| 5,824,608 | A | 10/1998 | Gotoch et al. | 6,537,427 B1 | 3/2003 | Raina et al. |
| 5,825,528 | A | 10/1998 | Goosen | 6,545,335 B1 | 4/2003 | Chua et al. |
| 5,835,255 | A | 11/1998 | Miles | 6,548,908 B2 | 4/2003 | Chua et al. |
| 5,838,484 | A | 11/1998 | Goosen et al. | 6,549,338 B1 | 4/2003 | Wolverton et al. |
| 5,842,088 | A | 11/1998 | Thompson | 6,552,840 B2 | 4/2003 | Knipe |
| 5,867,302 | A | 2/1999 | Fleming et al. | 6,574,033 B1 | 6/2003 | Chui et al. |
| 5,896,796 | A | 4/1999 | Chih | 6,577,785 B1 | 6/2003 | Spahn et al. |
| 5,912,758 | A | 6/1999 | Knipe et al. | 6,589,625 B1 | 7/2003 | Kothari et al. |
| 5,943,158 | A | 8/1999 | Ford et al. | 6,600,201 B2 | 7/2003 | Hartwell et al. |
| 5,959,763 | A | 9/1999 | Bozler et al. | 6,602,791 B2 | 8/2003 | Ouellet et al. |
| 5,967,163 | A | 10/1999 | Pan et al. | 6,606,175 B1 | 8/2003 | Sampsell et al. |
| 5,972,193 | A | 10/1999 | Chou et al. | 6,608,268 B1 | 8/2003 | Goldsmith |
| 5,976,902 | A | 11/1999 | Shih | 6,610,440 B1 | 8/2003 | LaFollette et al. |
| 5,986,796 | A | 11/1999 | Miles | 6,618,187 B2 | 9/2003 | Pilossof |
| 6,016,693 | A | 1/2000 | Viani et al. | 6,625,047 B2 | 9/2003 | Coleman, Jr. |
| 6,028,690 | A | 2/2000 | Carter et al. | 6,630,786 B2 | 10/2003 | Cummings et al. |
| 6,031,653 | A | 2/2000 | Wang | 6,632,698 B2 | 10/2003 | Ives |
| 6,038,056 | A | 3/2000 | Florence et al. | 6,635,919 B1 | 10/2003 | Melendez et al. |
| 6,040,937 | A | 3/2000 | Miles | 6,642,913 B1 | 11/2003 | Kimura et al. |
| 6,049,317 | A | 4/2000 | Thompson et al. | 6,643,069 B2 | 11/2003 | Dewald |
| 6,055,090 | A | 4/2000 | Miles | 6,650,455 B2 | 11/2003 | Miles |
| 6,057,903 | A | 5/2000 | Colgan et al. | 6,657,832 B2 | 12/2003 | Williams et al. |
| 6,061,075 | A | 5/2000 | Nelson et al. | 6,666,561 B1 | 12/2003 | Blakley |
| 6,099,132 | A | 8/2000 | Kaeriyama | 6,674,090 B1 | 1/2004 | Chua et al. |
| 6,100,872 | A | 8/2000 | Aratani et al. | 6,674,562 B1 | 1/2004 | Miles et al. |
| 6,113,239 | A | 9/2000 | Sampsell et al. | 6,674,563 B2 | 1/2004 | Chui et al. |
| 6,115,326 | A | 9/2000 | Puma et al. | 6,680,792 B2 | 1/2004 | Miles |
| 6,147,790 | A | 11/2000 | Meier et al. | 6,698,372 B2 | 3/2004 | Miles |
| 6,158,156 | A | 12/2000 | Patrick | 6,710,908 B2 | 3/2004 | Miles et al. |
| 6,160,833 | A | 12/2000 | Floyd et al. | 6,713,235 B1 | 3/2004 | Ide et al. |
| 6,165,890 | A | 12/2000 | Kohl et al. | 6,720,267 B1 | 4/2004 | Chen et al. |
| 6,166,422 | A | 12/2000 | Qian et al. | 6,736,987 B1 | 5/2004 | Cho |
| 6,180,428 | B1 | 1/2001 | Peeters et al. | 6,741,377 B2 | 5/2004 | Miles |
| 6,194,323 | B1 | 2/2001 | Downey et al. | 6,741,384 B1 | 5/2004 | Martin et al. |
| 6,195,196 | B1 | 2/2001 | Kimura et al. | 6,741,503 B1 | 5/2004 | Farris et al. |
| 6,201,633 | B1 | 3/2001 | Peeters et al. | 6,743,570 B2 | 6/2004 | Harnett et al. |
| 6,204,080 | B1 | 3/2001 | Hwang | 6,747,785 B2 | 6/2004 | Chen et al. |
| 6,215,221 | B1 | 4/2001 | Cabuz et al. | 6,747,800 B1 | 6/2004 | Lin |
| 6,232,936 | B1 | 5/2001 | Gove et al. | 6,756,317 B2 | 6/2004 | Sniegowski et al. |
| 6,243,149 | B1 | 6/2001 | Swanson et al. | 6,768,097 B1 | 7/2004 | Vikorovitch et al. |
| 6,246,398 | B1 | 6/2001 | Koo | 6,775,174 B2 | 8/2004 | Huffman et al. |
| 6,249,039 | B1 | 6/2001 | Harvey et al. | 6,778,155 B2 | 8/2004 | Doherty et al. |
| 6,282,010 | B1 | 8/2001 | Sulzbach et al. | 6,778,306 B2 | 8/2004 | Sniegowski et al. |
| 6,284,560 | B1 | 9/2001 | Jech et al. | 6,782,166 B1 | 8/2004 | Grote et al. |
| 6,288,472 | B1 | 9/2001 | Cabuz et al. | 6,794,119 B2 | 9/2004 | Miles |

| | | | | | |
|---|---|---|---|---|---|
| 6,806,110 B2 | 10/2004 | Lester et al. | 2003/0102771 A1 | 6/2003 | Akiba et al. |
| 6,811,267 B1 | 11/2004 | Allen et al. | 2003/0112096 A1 | 6/2003 | Potter |
| 6,812,482 B2 | 11/2004 | Fleming et al. | 2003/0138213 A1 | 7/2003 | Jiin et al. |
| 6,819,469 B1 | 11/2004 | Koba | 2003/0152872 A1 | 8/2003 | Miles |
| 6,822,628 B2 | 11/2004 | Dunphy et al. | 2003/0201784 A1 | 10/2003 | Potter |
| 6,829,132 B2 | 12/2004 | Martin et al. | 2003/0202264 A1 | 10/2003 | Weber et al. |
| 6,853,129 B1 | 2/2005 | Cummings et al. | 2003/0202265 A1 | 10/2003 | Reboa et al. |
| 6,855,610 B2 | 2/2005 | Tung et al. | 2003/0202266 A1 | 10/2003 | Ring et al. |
| 6,859,218 B2 | 2/2005 | Luman et al. | 2003/0231373 A1 | 12/2003 | Kowarz et al. |
| 6,861,277 B1 | 3/2005 | Monroe et al. | 2004/0010115 A1 | 1/2004 | Sotzing |
| 6,862,022 B2 | 3/2005 | Slupe | 2004/0027636 A1 | 2/2004 | Miles |
| 6,862,029 B1 | 3/2005 | D'Souza et al. | 2004/0027701 A1 | 2/2004 | Ishikawa |
| 6,867,896 B2 | 3/2005 | Miles | 2004/0028849 A1 | 2/2004 | Stark et al. |
| 6,870,581 B2 | 3/2005 | Li et al. | 2004/0035821 A1 | 2/2004 | Doan et al. |
| 6,870,654 B2 | 3/2005 | Lin et al. | 2004/0038513 A1 | 2/2004 | Kohl et al. |
| 6,882,458 B2 | 4/2005 | Lin et al. | 2004/0051929 A1 | 3/2004 | Sampsell et al. |
| 6,882,461 B1 | 4/2005 | Tsai et al. | 2004/0053434 A1 | 3/2004 | Bruner |
| 6,905,621 B2 | 6/2005 | Ho et al. | 2004/0058532 A1 | 3/2004 | Miles et al. |
| 6,912,022 B2 | 6/2005 | Lin et al. | 2004/0061543 A1 | 4/2004 | Nam et al. |
| 6,952,303 B2 | 10/2005 | Lin et al. | 2004/0063322 A1 | 4/2004 | Yang |
| 6,952,304 B2 | 10/2005 | Mushika et al. | 2004/0080807 A1 | 4/2004 | Chen et al. |
| 6,953,702 B2 | 10/2005 | Miller et al. | 2004/0080832 A1 | 4/2004 | Singh |
| 6,958,847 B2 | 10/2005 | Lin | 2004/0087086 A1 | 5/2004 | Lee |
| 6,972,891 B2 | 12/2005 | Patel et al. | 2004/0100677 A1 | 5/2004 | Huibers et al. |
| 6,980,350 B2 | 12/2005 | Hung et al. | 2004/0109250 A1 | 6/2004 | Choi et al. ............... 359/883 |
| 6,982,820 B2 | 1/2006 | Tsai | 2004/0124073 A1 | 7/2004 | Pilans et al. |
| 6,995,890 B2 | 2/2006 | Lin | 2004/0124483 A1 | 7/2004 | Partridge et al. |
| 6,999,225 B2 | 2/2006 | Lin | 2004/0124495 A1 | 7/2004 | Chen et al. |
| 6,999,236 B2 | 2/2006 | Lin | 2004/0125281 A1 | 7/2004 | Lin et al. |
| 7,008,812 B1 | 3/2006 | Carley | 2004/0125282 A1 | 7/2004 | Lin et al. |
| 7,012,726 B1 | 3/2006 | Miles | 2004/0125536 A1 | 7/2004 | Arney et al. |
| 7,027,202 B1 | 4/2006 | Hunter et al. | 2004/0136076 A1 | 7/2004 | Tayebati |
| 7,041,224 B2 | 5/2006 | Patel et al. | 2004/0145049 A1 | 7/2004 | McKinnell et al. |
| 7,041,571 B2 | 5/2006 | Strane | 2004/0145811 A1 | 7/2004 | Lin et al. |
| 7,049,164 B2 | 5/2006 | Bruner | 2004/0147056 A1 | 7/2004 | McKinnell et al. |
| 7,078,293 B2 | 7/2006 | Lin et al. | 2004/0147198 A1 | 7/2004 | Lin et al. |
| 7,110,158 B2 | 9/2006 | Miles | 2004/0148009 A1 | 7/2004 | Buzzard |
| 7,119,945 B2 | 10/2006 | Cummings et al. | 2004/0150869 A1 | 8/2004 | Kasai |
| 7,123,216 B1 | 10/2006 | Miles | 2004/0160143 A1 | 8/2004 | Shreeve et al. |
| 7,172,915 B2 | 2/2007 | Lin et al. | 2004/0174583 A1 | 9/2004 | Chen et al. |
| 7,198,973 B2 | 4/2007 | Lin et al. | 2004/0175577 A1 | 9/2004 | Lin et al. |
| 7,221,495 B2 | 5/2007 | Miles et al. | 2004/0179281 A1 | 9/2004 | Reboa |
| 7,256,107 B2 | 8/2007 | Takeuchi et al. | 2004/0179445 A1 | 9/2004 | Park |
| 2001/0003487 A1 | 6/2001 | Miles | 2004/0191937 A1 | 9/2004 | Patel et al. |
| 2001/0026951 A1 | 10/2001 | Vergani et al. | 2004/0191946 A1 | 9/2004 | Patel et al. |
| 2001/0040649 A1 | 11/2001 | Ozaki | 2004/0197526 A1 | 10/2004 | Mehta |
| 2001/0040675 A1 | 11/2001 | True et al. | 2004/0207897 A1 | 10/2004 | Lin |
| 2002/0003400 A1 | 1/2002 | Lee | 2004/0207898 A1 | 10/2004 | Lin et al. |
| 2002/0014579 A1 | 2/2002 | Dunfield | 2004/0209192 A1 | 10/2004 | Lin et al. |
| 2002/0015215 A1 | 2/2002 | Miles | 2004/0209195 A1 | 10/2004 | Lin |
| 2002/0021485 A1 | 2/2002 | Pilossof | 2004/0212026 A1 | 10/2004 | Van Brocklin et al. |
| 2002/0024711 A1 | 2/2002 | Miles | 2004/0217264 A1 | 11/2004 | Wood et al. |
| 2002/0027636 A1 | 3/2002 | Yamada | 2004/0217378 A1 | 11/2004 | Martin et al. |
| 2002/0036304 A1 | 3/2002 | Ehmke et al. | 2004/0217919 A1 | 11/2004 | Pichl et al. |
| 2002/0054424 A1 | 5/2002 | Miles | 2004/0218251 A1 | 11/2004 | Piehl et al. |
| 2002/0055253 A1 | 5/2002 | Rudhard | 2004/0218334 A1 | 11/2004 | Martin et al. |
| 2002/0071169 A1 | 6/2002 | Bowers et al. | 2004/0218341 A1 | 11/2004 | Martin et al. |
| 2002/0075555 A1 | 6/2002 | Miles | 2004/0227493 A1 | 11/2004 | Van Brocklin et al. |
| 2002/0086455 A1 | 7/2002 | Franosch et al. | 2004/0240027 A1 | 12/2004 | Lin et al. |
| 2002/0110948 A1 | 8/2002 | Huang et al. | 2004/0240032 A1 | 12/2004 | Miles |
| 2002/0117728 A1 | 8/2002 | Brosnihan et al. | 2004/0240138 A1 | 12/2004 | Martin et al. |
| 2002/0126364 A1 | 9/2002 | Miles | 2004/0245588 A1 | 12/2004 | Nikkel et al. |
| 2002/0135857 A1 | 9/2002 | Fitzpatrick et al. | 2004/0263944 A1 | 12/2004 | Miles et al. |
| 2002/0137072 A1 | 9/2002 | Mirkin et al. | 2005/0001828 A1 | 1/2005 | Martin et al. |
| 2002/0149828 A1 | 10/2002 | Miles | 2005/0003667 A1 | 1/2005 | Lin et al. |
| 2002/0150130 A1 | 10/2002 | Coldren et al. ............... 372/20 | 2005/0012577 A1 | 1/2005 | Pillans et al. |
| 2002/0168136 A1 | 11/2002 | Atia et al. | 2005/0014374 A1 | 1/2005 | Partridge et al. |
| 2003/0006468 A1 | 1/2003 | Ma et al. | 2005/0020089 A1 | 1/2005 | Shi et al. |
| 2003/0043157 A1 | 3/2003 | Miles | 2005/0024557 A1 | 2/2005 | Lin |
| 2003/0054588 A1 | 3/2003 | Patel et al. | 2005/0035699 A1 | 2/2005 | Tsai |
| 2003/0062186 A1 | 4/2003 | Boroson et al. | 2005/0036095 A1 | 2/2005 | Yeh et al. |
| 2003/0072070 A1 | 4/2003 | Miles | 2005/0036192 A1 | 2/2005 | Lin et al. |
| 2003/0090350 A1 | 5/2003 | Feng et al. | 2005/0038950 A1 | 2/2005 | Adelmann |

| | | | | | | |
|---|---|---|---|---|---|---|
| 2005/0042117 | A1 | 2/2005 | Lin | JP | 2004-212656 | 7/2004 |
| 2005/0045276 | A1 | 3/2005 | Patel et al. | JP | 2005051007 A | 2/2005 |
| 2005/0046922 | A1 | 3/2005 | Lin et al. | KR | 2002-9270 | 10/1999 |
| 2005/0046948 | A1 | 3/2005 | Lin | KR | 2000-0033006 | 6/2000 |
| 2005/0057442 | A1 | 3/2005 | Way | WO | WO 91/05284 | 4/1991 |
| 2005/0068583 | A1 | 3/2005 | Gutkowski et al. | WO | WO 92/10925 | 6/1992 |
| 2005/0068605 | A1 | 3/2005 | Tsai | WO | WO9530924 | 11/1995 |
| 2005/0068606 | A1 | 3/2005 | Tsai | WO | WO9717628 | 5/1997 |
| 2005/0069209 | A1 | 3/2005 | Damera-Venkata et al. | WO | WO9952006 A2 | 10/1999 |
| 2005/0078348 | A1 | 4/2005 | Lin | WO | WO9952006 A3 | 10/1999 |
| 2005/0098840 | A1 | 5/2005 | Fuertsch et al. | WO | WO0114248 | 3/2001 |
| 2005/0118832 | A1 | 6/2005 | Korzenski et al. | WO | WO 01/63657 | 8/2001 |
| 2005/0168849 | A1 | 8/2005 | Lin | WO | WO 02/24570 | 3/2002 |
| 2005/0170670 | A1 | 8/2005 | King et al. | WO | WO03007049 A1 | 1/2003 |
| 2005/0195462 | A1 | 9/2005 | Lin | WO | WO 03/052506 | 6/2003 |
| 2005/0195467 | A1 | 9/2005 | Kothari et al. | WO | WO 03/069413 A | 8/2003 |
| 2005/0202649 | A1 | 9/2005 | Hung et al. | WO | WO03069413 A1 | 8/2003 |
| 2005/0249966 | A1 | 11/2005 | Tung et al. | WO | WO03073151 A1 | 9/2003 |
| 2006/0066932 | A1 | 3/2006 | Chui | WO | WO2004006003 A1 | 1/2004 |
| 2006/0066935 | A1 | 3/2006 | Cummings et al. | WO | WO2004026757 A2 | 4/2004 |
| 2006/0076311 | A1 | 4/2006 | Tung et al. | WO | WO 2004/055885 | 7/2004 |
| 2006/0077502 | A1 | 4/2006 | Tung et al. | WO | WO 2004/079056 | 9/2004 |
| 2006/0077526 | A1 | 4/2006 | Yun ............ 359/291 | WO | WO 2005/019899 A1 | 3/2005 |
| 2006/0077529 | A1 | 4/2006 | Chui et al. | WO | WO 2005/061378 | 7/2005 |
| 2006/0177950 | A1 | 8/2006 | Lin et al. | WO | WO 2005/085932 A | 9/2005 |
| 2006/0256420 | A1 | 11/2006 | Miles et al. | WO | WO 2006/036385 | 4/2006 |
| 2006/0257070 | A1 | 11/2006 | Lin et al. | WO | WO 2006/036437 | 4/2006 |
| 2007/0018761 | A1 | 1/2007 | Yamanaka et al. ............ 335/78 | WO | WO 2006/036542 | 4/2006 |
| 2007/0057600 | A1 | 3/2007 | Fukuda et al. ............ 310/324 | | | |
| 2007/0155051 | A1 | 7/2007 | Wang et al. | | | |
| 2007/0269748 | A1 | 11/2007 | Miles | | | |
| 2008/0026328 | A1 | 1/2008 | Miles | | | |
| 2008/0068699 | A1 | 3/2008 | Miles | | | |
| 2008/0130089 | A1 | 6/2008 | Miles | | | |
| 2008/0165122 | A1 | 7/2008 | Duthaler et al. ............ 345/107 | | | |
| 2008/0226929 | A1 | 9/2008 | Chung et al. | | | |

FOREIGN PATENT DOCUMENTS

| | | |
|---|---|---|
| CN | 092109265 | 11/2003 |
| DE | 199 38 072 | 3/2000 |
| DE | 10228946 A1 | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 | 2/1996 |
| EP | 0 788 005 | 8/1997 |
| EP | 0878824 A2 | 11/1998 |
| EP | 1197778 | 4/2002 |
| EP | 1 209 738 | 5/2002 |
| EP | 1258860 A1 | 11/2002 |
| EP | 1 452 481 A | 9/2004 |
| JP | 49-004993 | 1/1974 |
| JP | 405275401 A | 10/1993 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2001-085519 | 3/2001 |
| JP | 2002-0287047 | 3/2001 |
| JP | 2002 062493 | 2/2002 |
| JP | 2002-207182 | 7/2002 |
| JP | 2002-243937 | 8/2002 |
| JP | 2002-270575 | 9/2002 |
| JP | 2002-328313 | 11/2002 |
| JP | 2002-355800 | 12/2002 |
| JP | 2003001598 A | 1/2003 |
| JP | 2004-102022 A | 4/2004 |
| JP | 2004-133281 | 4/2004 |
| JP | 2004106074 A | 4/2004 |

OTHER PUBLICATIONS

Akasaka, "Three-Dimensional IC Trends," Proceedings of IEEE, vol. 74, No. 12, pp. 1703-1714, (Dec. 1986).
Austrian Search Report dated May 4, 2005.
Austrian Search Report dated Aug. 12, 2005.
Aratani et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573. (date unknown).
Jerman et al., "A Miniature Fabry-Perot Interferometer with a Corrugated Silicon Diaphragm Support," (1988).

Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. 1996.
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
PCT/US02/13442, Search Report Sep. 13, 2002.
PCT/US04/20330 Search Report Nov. 8, 2004.
PCT/US05/029821 International Search Report (Dec. 27, 2005).
PCT/US05/030927 International Search Report (Jan. 25, 2006).
PCT/US05/031693 International Search Report (Jan. 25, 2006).
PCT/US05/032331 International Search Report (Apr. 7, 2006).
PCT/US05/033558 Partial International Search Report (Feb. 24, 2006).
PCT/US2004/035820 International Search Report and Written Opinion (Apr. 11, 2005).
PCT/US96/17731 Search Report (Jan. 28, 1997).
Raley et al., "A Fabry-Perot Microinterferometer for Visible Wavelengths," IEEE Solid-State Sensor and Actuator Workshop, Jun. 1992, Hilton Head, SC.
Schnakenberg et al., "TMAHW Etchants for Silicon Micromachining," 1991 International Conference on Solid State Sensors and Actuators-Digest of Technical Papers, pp. 815-818 (1991).
Sperger et al., "High Performance Patterned All-Dielectric Interference Colour Filter for Display Applications," SID Digest, pp. 81-83, (1994).
Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Walker, et al., "Electron-beam-tunable Interference Filter Spatial Light Modulator," Optics Letters vol. 13, No. 5, pp. 345-347, (May 1988).
Williams et al., "Etch Rates for Micromachining Processing," Journal of Microelectromechanical Systems, vol. 5, No. 4, pp. 256-259 (Dec. 1996).
Winters et al., "The etching of silicon with XeF2 vapor. Applied Physics Letters," vol. 34, No. 1, pp. 70-73 (Jan. 1979).
Winton, "A novel way to capture solar energy," Chemical Week, (May 1985).

Wu, "Design of a Reflective Color LCD Using Optical Interference Reflectors," ASIA Display '95, pp. 929-931, (Oct. 1995).
Zhou et al., "Waveguide Panel Display Using Electromechanical Spatial Modulators" SID Digest, vol. XXIX, (1998).
Yao et al., BrF3 dry release technology for large freestanding parylene microstructures and electrostatic actuators, Sensors and Actuators A, vol. 97-98, pp. 771-775, Apr. 2002.
International Search Report and Written Opinion issued in PCT/US2007/003267 on Nov. 9, 2007.
RCO Pt Pub 157313, May 1, 1991, FSI International.
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Crouse, "Self-ordered pore structure of anodized aluminum on silicon and pattern transfer" Applied Physics Letters, vol. 76, No. 1, Jan. 3, 2000. pp. 49-51.
French, P.J. "Development of Surface Micromachining techniques compatable with on-chip electronics" Journal of Micromechanics and Microengineering vol. 6 No. 2, 197-211 XP 002360789 Jun. 1996 IOP Publishing.
Furneaux, et al. "The Formation of Controlled-porosity membranes from Anodically Oxidized Aluminium" Nature vo 337 Jan. 12, 1989, pp. 147-149.
Jerman J. H. et al., "Maniature Fabry-Perot Interferometers Micromachined in Silicon for Use in Optical Fiber WDM Systems," Transducers. San Francisco, Jun. 24-27, 1991, Proceedings of the International Conference on Solid State Sensors Andactuators, New Youk IEEE, US, vol. Conf. 6, Jun. 24, 1991.
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Maboudian, et al. Critical Review: Adhesion in Surface Micromechanical Structures: J. Vac. Sci Techno. B 15(1) Jan./Feb. 1997, pp. 1-20.
Microchem, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).
Penta Vacuum MEMS Etcher Specifications, http://www.pentavacuum.com/memes.htm. (Jan. 5, 2005).
Science and Technology, The Economist, pp. 89-90, (May 1999).
Search Report PCT/US05/030033 and Written Opinion. (Dec. 30, 2005).
Search Report PCT/US05/030902. (Jan. 26, 2006).
Search Report and Written Opinion for PCT/US05/33558 (May 19, 2005).
Search Report PCT/US05/032331 (Apr. 7, 2006).
Search Report PCT/US05/032331 (Jan. 9, 2006).
Search Report and written opinion PCT/US05/032647 (Dec. 28, 2005).

Tayebi et al. "Reducing the Effects of adhesion and friction in microelectromechanical systesm (MEMS) through surface roughening: Comparison Between theory and experiments" http://jap.ajp.org/jap/copyright.isp Journal of applied Physics 98, 073528 (2005).

Thin Film Transistors- Materials and Processes - vol. 1 Amorphous Silicon Thin Film Transistors ed. Yue Kuo, Kluwer Academic Publishers, Boston (2004).

Xactix Xetch X Specifications, http://xactix.com/Xtech X3specs.htm. Jan. 5, 2005.

Xactix Xetch Product information.

Annex to Form PCT/ISA/206 Communication Relating to the Results of the Partial International Search issued in an invitation to Correct Defects in PCT/US2007/003267 on Aug. 10, 2007.

ELECTRICAL CONDITIONING OF MEMS DEVICE AND INSULATING LAYER THEREOF

FIELD OF THE INVENTION

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one embodiment, a method of making a MEMS device is provided, the method including forming a first electrode layer, forming a dielectric layer over the first electrode layer, depositing a layer of sacrificial material over the dielectric layer, where the layer of sacrificial material is conductive, and where the layer of sacrificial material is in electrical communication with the dielectric layer, and applying a voltage to said layer of sacrificial material.

In another embodiment, a method of testing a partially fabricated MEMS device is provided, including applying a voltage between a conductive sacrificial layer and a first electrode layer, where a dielectric layer is located between said sacrificial layer and said first electrode layer, and measuring the resistance across at least the conductive sacrificial layer, the first electrode layer, and any intervening layers.

In another embodiment, a system for conditioning a partially fabricated MEMS device is provided, the system including a substrate, a first electrode layer located over the substrate, a dielectric layer located over the first electrode layer, a conductive sacrificial layer located over the dielectric layer, and a power source in electrical communication with the conductive sacrificial layer.

In another embodiment, a method of fabricating a MEMS device is provided, the method including providing a first electrode layer, providing a dielectric layer located over the first electrode layer, providing a conductive sacrificial layer located over the dielectric layer, providing a second electrode layer located over the conductive sacrificial layer, applying a voltage to the conductive sacrificial layer for a period of time, and etching the conductive sacrificial material to define a cavity.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Insulating layers used in MEMS devices such as interferometric modulators are prone to charge accumulation, which may result in a shift in operating voltage and have unexpected effects on performance, particularly soon after fabrication of the MEMS device. Sustained application of voltage across the insulating layer conditions the insulating layer, stabilizing and/or saturating the insulating layer with charge, resulting in more consistent and predictable performance, especially across an array of MEMS devices. While such voltage may be applied by driving the fabricated MEMS device to an actuated state and maintaining a certain voltage for a period of time, methods are described herein to apply the desired voltage via a conductive sacrificial layer when the MEMS device is partially fabricated. The conductive sacrificial layer advantageously makes contact with the dielectric layer, or other underlying layers, even near support structures such as support post, where an actuated reflective layer would not, and certain sacrificial materials are particularly conductive. In addition, because the conductive sacrificial material may comprise a contiguous layer which extends throughout the MEMS array, the application of such voltage is simplified.

Figure 1:
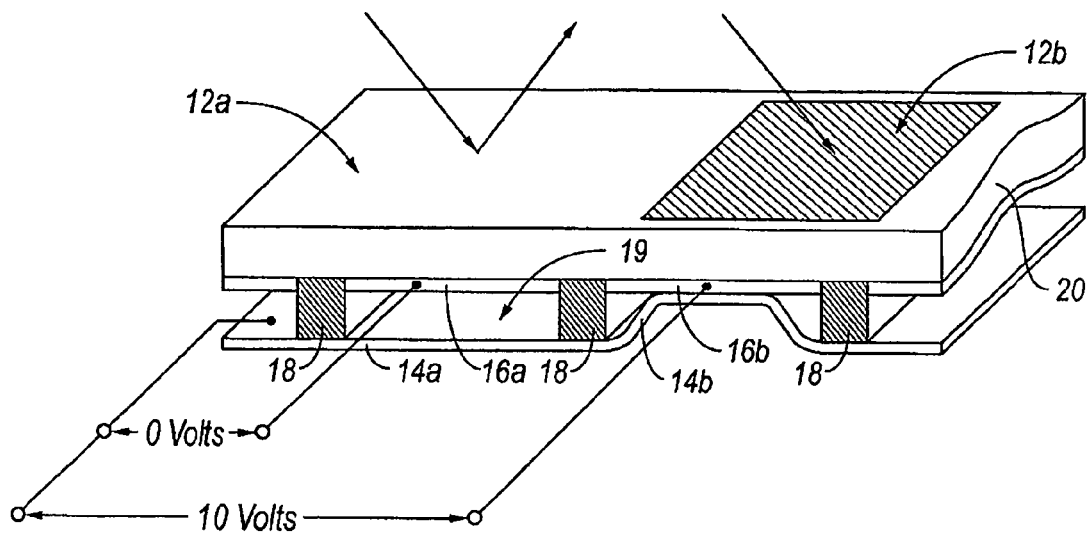
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
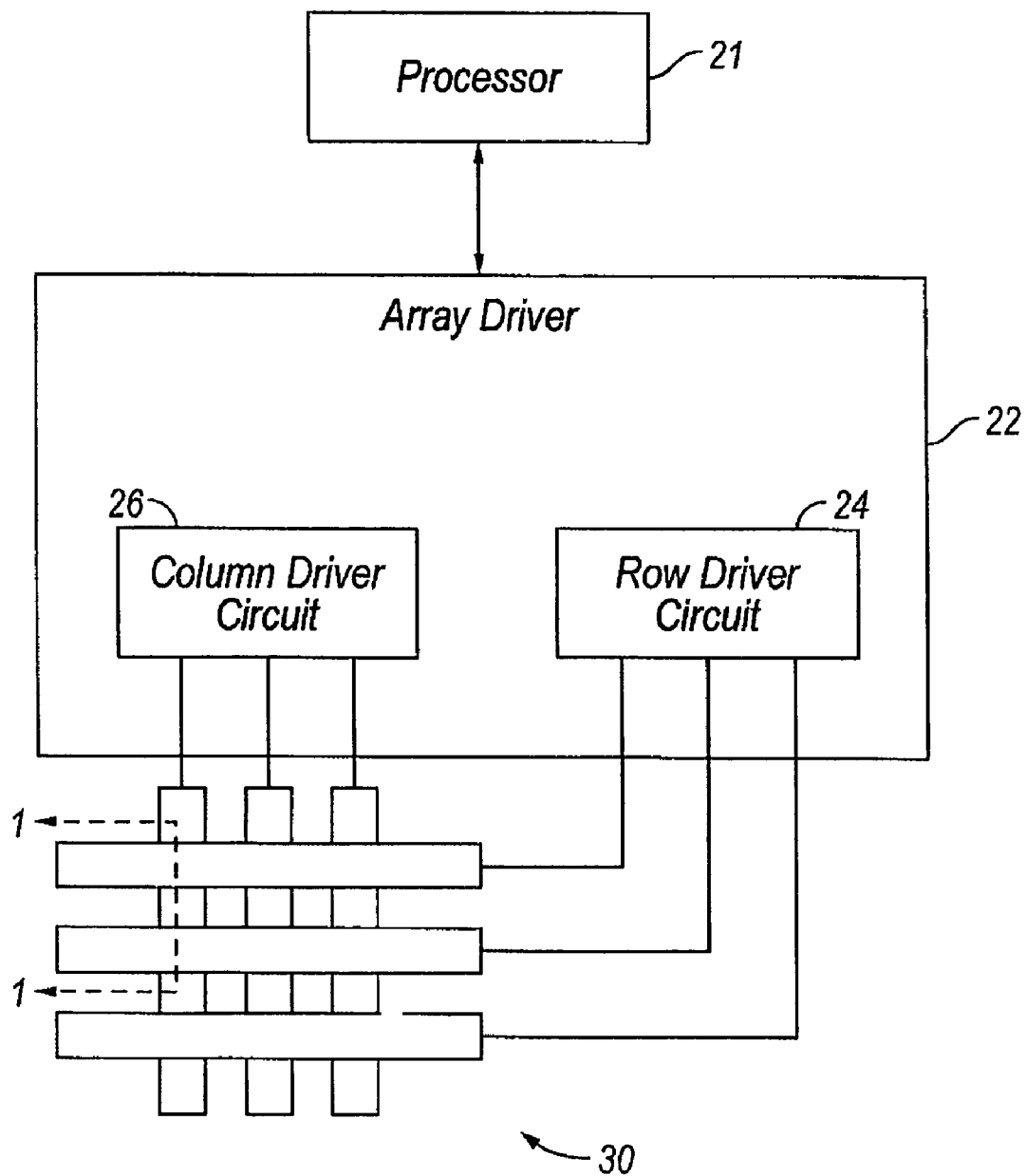
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
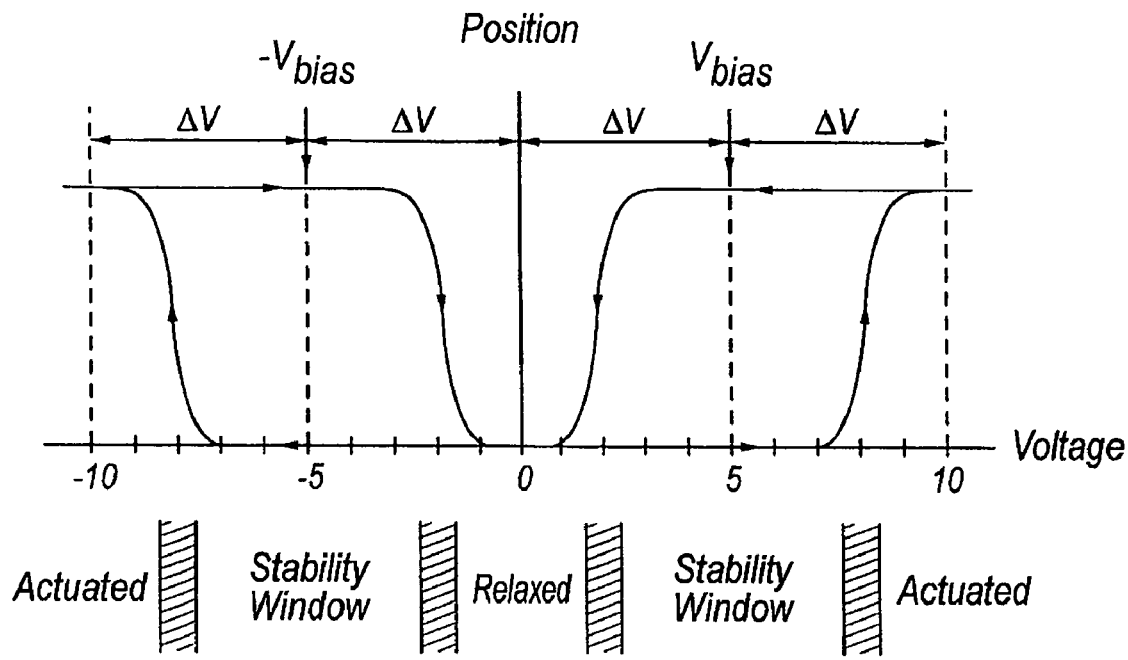
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
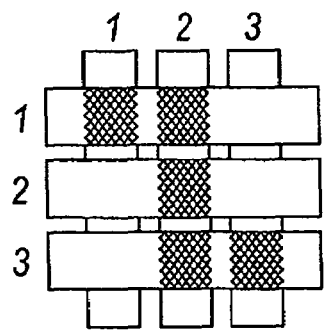
FIGS. 5A and 5B illustrate one exemplary timing diagram for row and column signals that may be used to write a frame of display data to the 3×3 interferometric modulator display of FIG. 2.
Figure 5B:
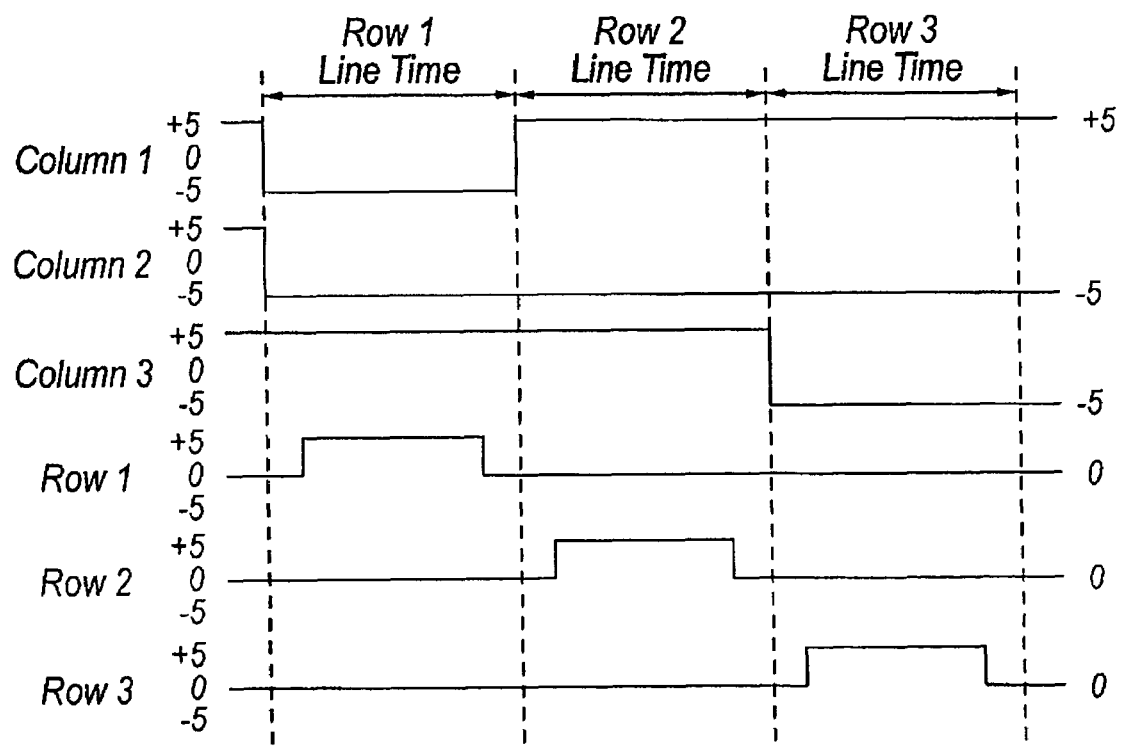

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
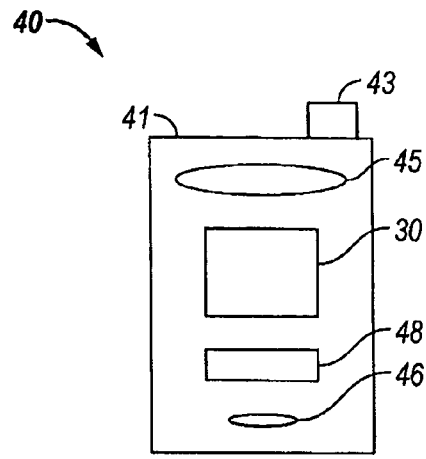
FIGS. 6A and 6B are system block diagrams illustrating an embodiment of a visual display device comprising a plurality of interferometric modulators.
Figure 6B:
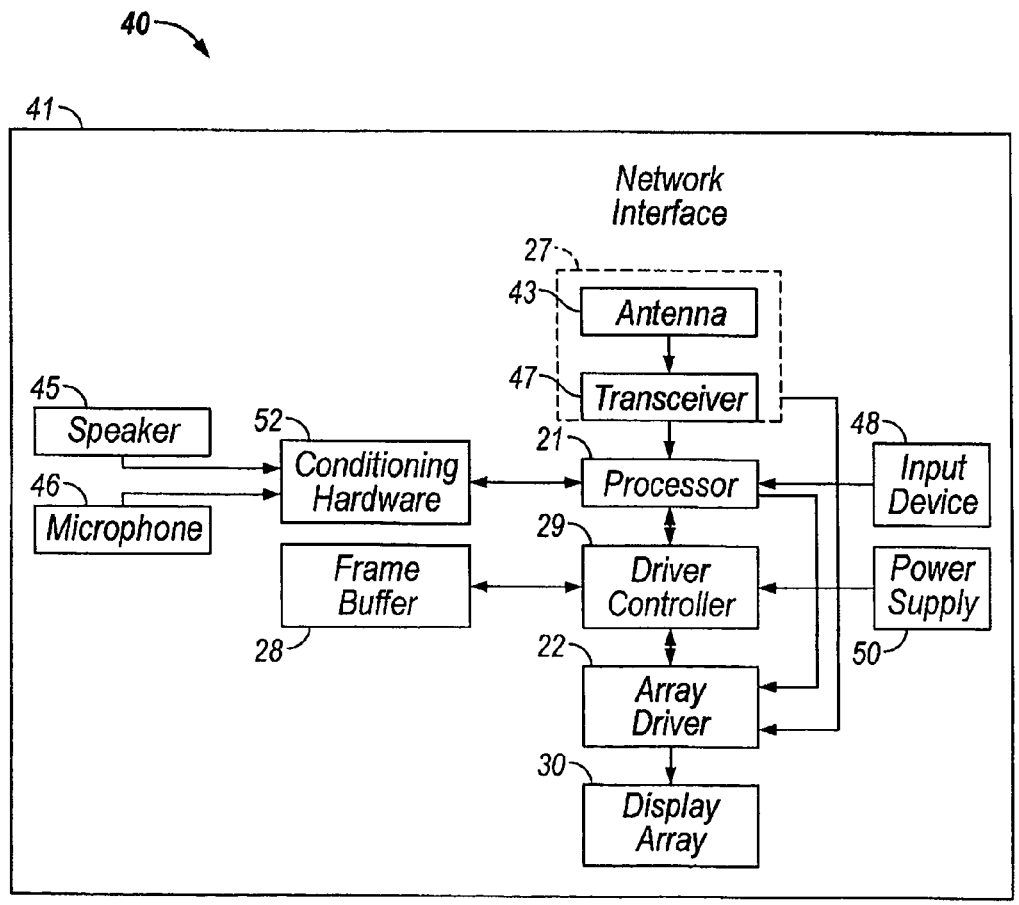

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a memory device such as digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
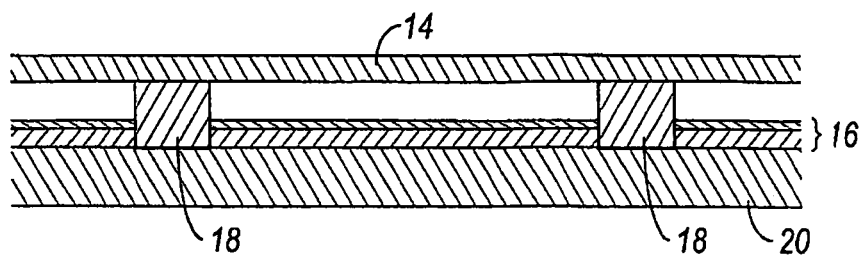
FIG. 7A is a cross section of the device of FIG. 1.
Figure 7B:
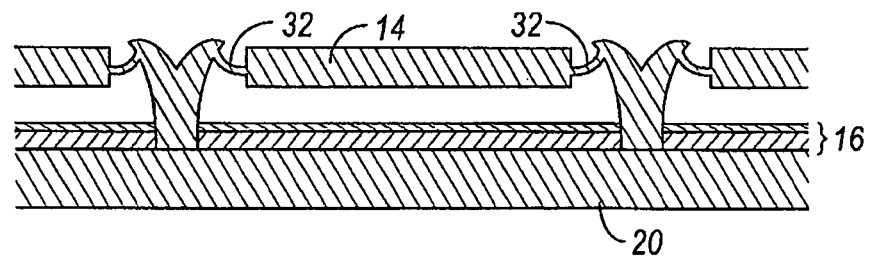
FIG. 7B is a cross section of an alternative embodiment of an interferometric modulator.
Figure 7C:
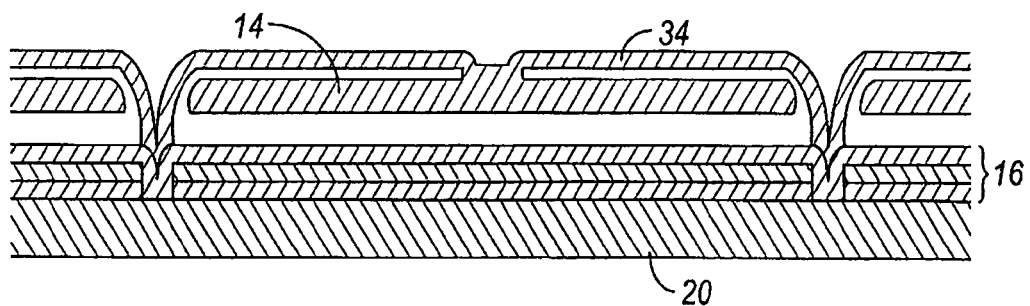
FIG. 7C is a cross section of another alternative embodiment of an interferometric modulator.
Figure 7D:
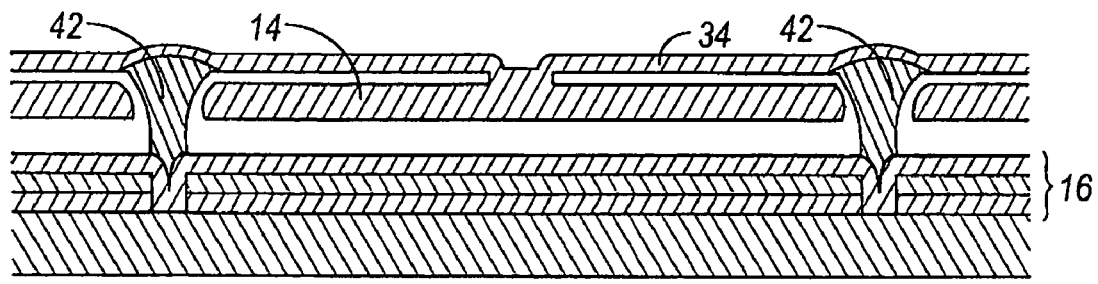
FIG. 7D is a cross section of yet another alternative embodiment of an interferometric modulator.
Figure 7E:
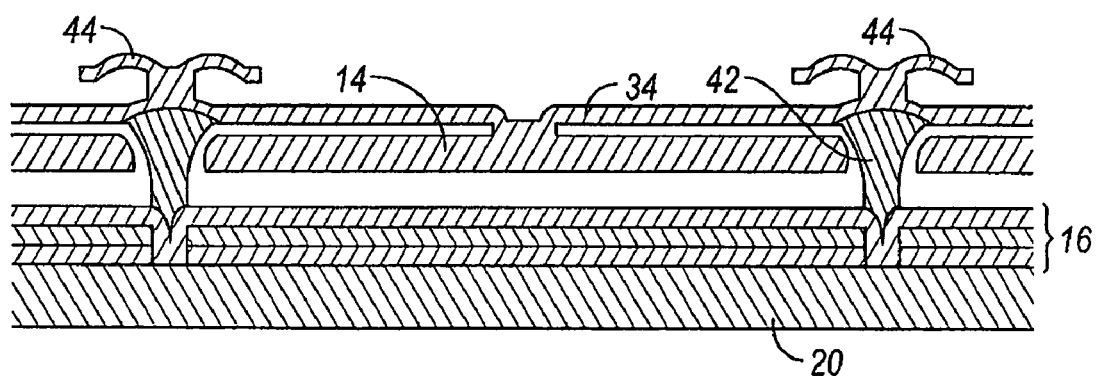
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports 18 at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support structures or posts. The embodiment illustrated in FIG. 7D has support structures 18, that include support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts 18 are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

As discussed above, in many embodiments, the optical stack in an interferometric modulator comprises a dielectric layer located between the electrodes, such as above a fixed electrode, which serves to insulate the fixed electrode from the movable electrode, preventing shorts when the movable electrode is actuated to a position adjacent the optical stack. However, many dielectric materials are prone to problems such as charge accumulation, charge leakage, or shorting through the dielectric layer. The operation of an interferometric modulator element can be affected by any of these problems.

The accumulation of charge within the dielectric layer serves to shift the operating voltage of an interferometric modulator element, since the element is actuated through the accumulation of charge due to the application of a voltage across the two electrodes, resulting in attraction. The presence of preexisting charge within the dielectric layer alters the voltage necessary to accumulate sufficient charge to actuate the movable electrode towards the optical stack. Similarly, the release voltage, at which insufficient charge remains to overcome the mechanical restoring force, can be altered as well by the presence of charge. Both leakage currents and shorting— which is essentially an extreme version of leakage current— will similarly affect the operating voltage of the interferometric modulator element.

In addition to the general effect that accumulated charge or leakage currents may have on the operating voltage of an individual interferometric modulator element, there may be differences in the effect among different interferometric modulator elements. In an array of interferometric modulator elements, the effect of the accumulated charge or leakage currents may vary at different locations. For instance, a larger amount of charge may accumulate in a particular portion of an array, and the operation of that portion of the array may differ from that of the surrounding portions, causing those modulators to not actuate when they are intended to. Charge leakage may also be localized at a particular location, due to, for example, defects in the dielectric layer.

It will be understood that the problems are not unique to interferometric modulators, but may affect any MEMS device in which a movable electrode is driven through a gap towards another electrode, and a dielectric layer is used to separate the two. Other types of MEMS devices which may experience similar problems include, but are not limited to, MEMS switches, MEMS latches, and DLP devices (digital light processing devices, which are reflective MEMS devices) While much of the following disclosure is directed to the fabrication and testing of interferometric modulator elements, it will be understood that the following methods and apparatuses may be adapted for use in the fabrication and testing of other MEMS devices having similar features.

Certain methods for addressing the problem of accumulated charge and for testing for the problem of leakage current involves an electrical conditioning process, also referred to as a "burn-in" process, which may be performed at the end or near the end of the fabrication of a MEMS device such as an interferometric modulator. This conditioning process may also be referred to as an "aging" process. In one embodiment of such a process, the MEMS device is driven to an actuated state and held in the actuated state for a period of time.

Figure 8A:
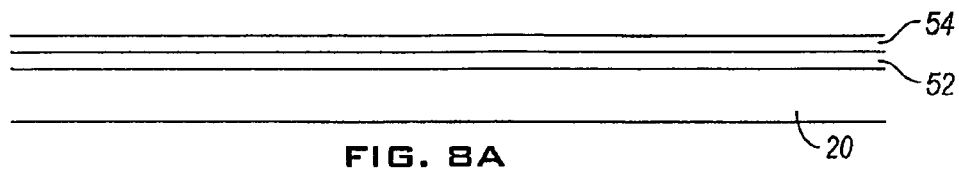
FIGS. 8A-8F are cross-sections depicting certain steps in the fabrication of a MEMS device.

FIGS. 8A-8F illustrate an exemplary method of fabricating a MEMS device, which in this case comprises an interferometric modulator. In FIG. 8A, a substrate 20 is provided, and an electrode layer 52 is deposited over the substrate. A partially reflective layer 54 is then deposited over the electrode layer. In one embodiment, the electrode layer 52 is a transparent conductive material, such as indium-tin-oxide (ITO), and the partially reflective layer 54 comprises a material such as chromium (Cr). It will be understood, however, that in the fabrication of other devices, including MEMS switches and alternate structures for interferometric modulation, the partially reflective layer may be located elsewhere or not included, and the electrode layer may be opaque. In another embodiment, the electrode layer itself may be partially reflective.

Figure 8B:
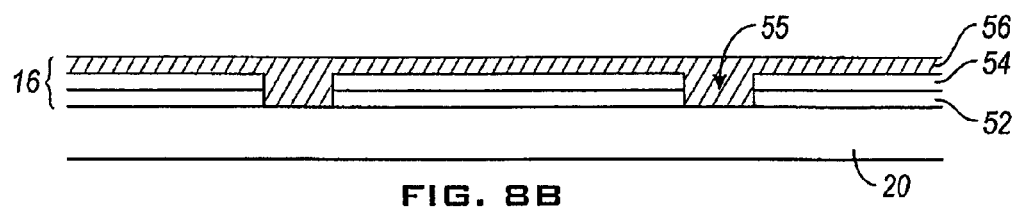

In FIG. 8B, it can be seen that the electrode layer 52 and the partially reflective layer 54 are patterned and etched, and a dielectric layer 56, alternately referred to as an insulating layer, is deposited over the partially reflective layer, forming an optical stack 16. The patterning and etching of the electrode layer and the partially reflective layer may be done, for instance, to form strip electrodes on the surface of the substrate, separated by gaps 55. The patterning and etching may also be used to remove the electrode and partially reflective surfaces from underneath support structures to be formed and other non-active portions of the display, if desired. In certain embodiments, the dielectric layer 56 may comprise silicon oxide or silicon nitride, but other suitable insulating materials, such as other oxides, may also be used. In other embodiments, dielectric layer 56 may comprise multiple dielectric layers. For instance, dielectric layer 56 may comprise an $Al_2O_3$ layer located over an $SiO_2$ layer, and in a further embodiment may comprise an additional $SiO_2$ layer located over the $Al_2O_3$ layer.

Figure 8C:
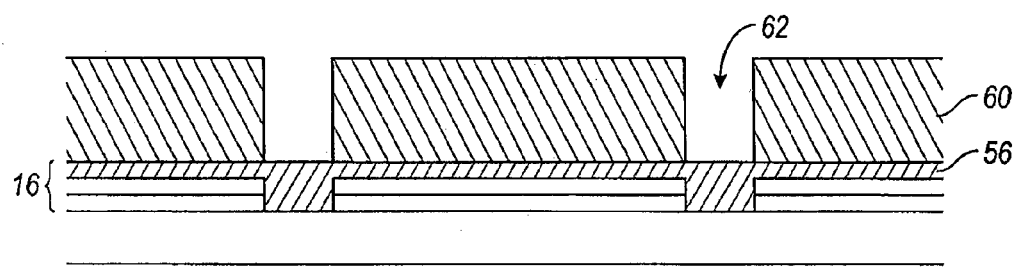

In FIG. 8C, it can be seen that a sacrificial layer 60 is deposited over the dielectric layer, and may be patterned and etched to form apertures 62 as shown. The height of the sacrificial layer 60 will determine the distance between the fixed and movable electrodes in the finished interferometric modulator. In FIG. 8C, the sacrificial layer 60 is shown as having a constant thickness, but it will be understood that a sacrificial layer having a varying thickness may be used to fabricate, for example, an array of interferometric modulators wherein different modulators reflect different colors, based on the distance between the electrodes. The apertures 62 enable the formation of support structures, such as the support posts 18 of FIG. 1, which may be used to maintain the separation between the fixed and movable electrodes. In certain embodiments, the sacrificial material may comprise molybdenum, amorphous silicon, polysilicon, or any other suitable material. Preferably, the sacrificial material is selectively etchable relative to any adjacent layers or structures, to facilitate later removal of the sacrificial material without significant damage to those layers/structures. As discussed below, the sacrificial material is preferably conductive, as well. If it is desirable to use materials in adjacent structures which do not permit selective etching of the sacrificial material relative to those materials, an etch barrier layer (not shown), may be deposited to protect the adjacent layer/structure from the sacrificial etch.

Figure 8D:
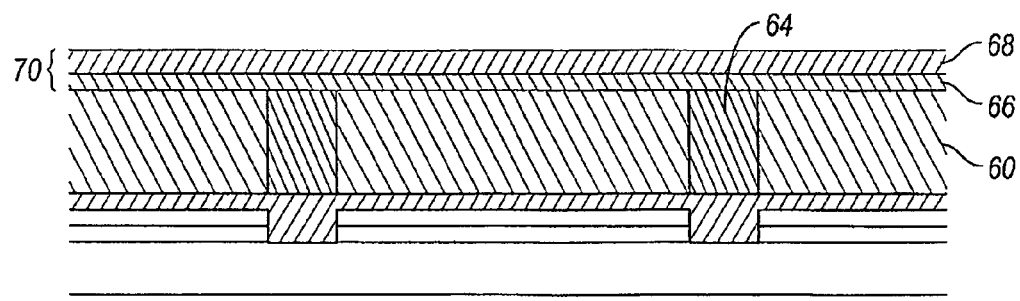

In FIG. 8D, it can be seen that support structures 64 are formed within the apertures 62, and a reflective layer 66 and a deformable layer 68 are deposited over the sacrificial layer 60 and support structures 64, forming a deformable reflective layer 70. The support structures 64 may be formed in a variety of ways, and may be formed from a variety of suitable materials, including but not limited to photoresist, spin-on glass, silicon oxide, silicon nitride, and aluminum oxide. Support structures having different shapes may also be formed.

In the depicted embodiment, the deformable reflective layer 70 is formed from two distinct layers. In certain embodiments, the reflective layer 66 comprises a material with high reflectivity, such as aluminum. The deformable layer 68 need not be selected for its reflectivity, but may be selected instead on the basis of suitable mechanical properties, and may comprise materials such as nickel. In one alternate embodiment, the deformable reflective layer 70 may be formed from a single layer having suitable reflective and mechanical properties. In another alternate embodiment, a reflective layer may be formed suspended by a connector or tether from a deformable layer, as depicted in the finished interferometric modulators of FIGS. 7C-7E. Fabrication of such modulators may require modification of the above process to deposit an additional layer of sacrificial material to define the gap between the suspended reflective layer and the overlying mechanical layer.

Figure 8E:
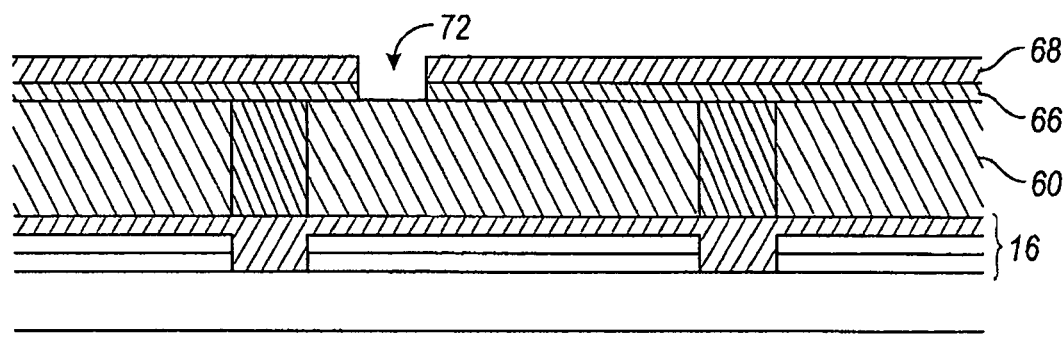

In FIG. 8E, the overlying layers, such as the reflective layer 66 and the deformable layer 68 are patterned and etched to form desired structures. In certain embodiments, the overlying layers may be patterned and etched to form etch holes 72, which facilitate the later etching of the sacrificial material by exposing additional portions of the sacrificial layer 60. The overlying layers may also be patterned and etched to form strip electrodes, which run perpendicular to the fixed strip electrodes formed on the substrate as discussed above. Because the sacrificial material inhibits the movement of the overlying layers, the MEMS device is referred to as "unreleased" at this stage in the fabrication process.

Figure 8F:
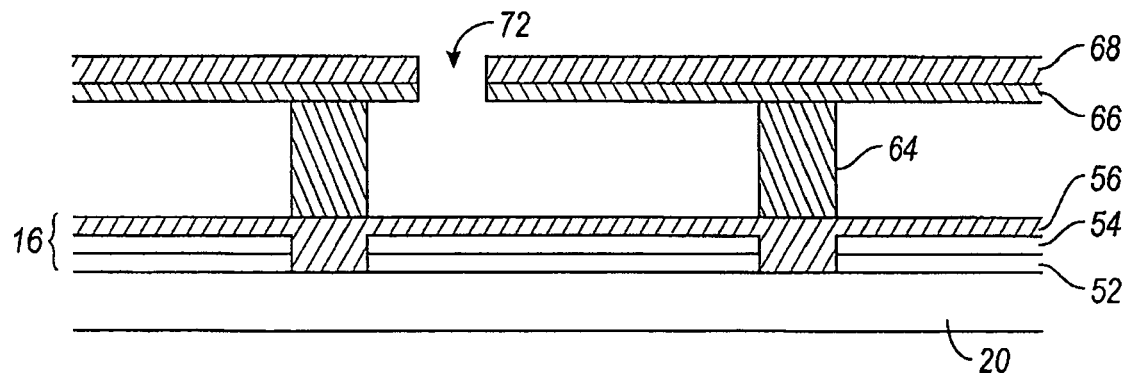

In FIG. 8F, a sacrificial etch is performed to remove the sacrificial layer 60, permitting movement of the overlying electrodes towards the fixed electrodes on the substrate. The MEMS device is therefore referred to as "released." It can be seen that this process will form a released interferometric modulator similar to the modulator of FIG. 1.

It will be understood that the above process may be modified as necessary if alternate or additional structures are to be formed. For instance, certain steps may be performed in a different order, or may be left out altogether.

Figure 9A:
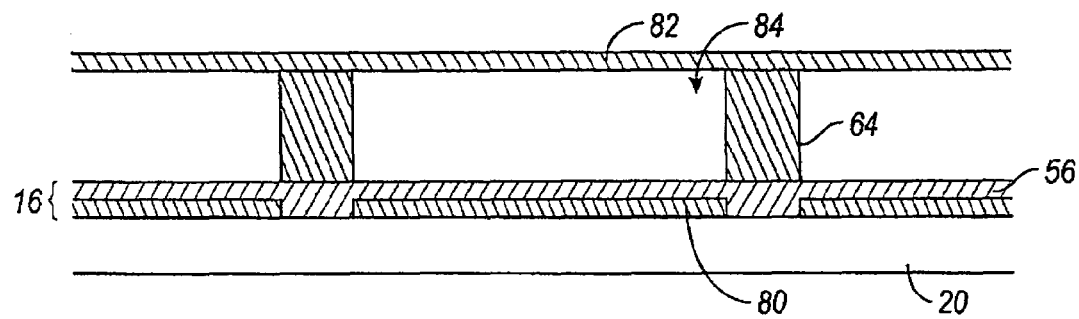
FIG. 9A is a cross-section of a MEMS device in an unactuated state.

In one embodiment, discussed briefly above, a conditioning process may be performed on a released MEMS device, at a stage such as that depicted in FIG. 8F, once the sacrificial layer 60 has been removed. FIG. 9A depicts a MEMS device similar to the interferometric modulator of FIG. 8F, comprising a substrate 20, a first electrode 80 located on the substrate, and a dielectric layer 56 located over the first electrode. In an embodiment in which the MEMS device is an interferometric modulator, these layers may form the optical stack 16 for an interferometric modulator, such as the optical stack 16 of FIG. 1. It will be understood that in such an embodiment, the optical stack 16 may comprise additional layers not shown, such as a partially reflective layer between the first electrode 80 and the dielectric layer 56. Support structures 64 space a second electrode 82 apart from the dielectric layer 56 by an air gap 84. While an interferometric modulator is one example of a MEMS device having such a structure or a similar structure, other MEMS devices, such as switches and latches may also include a movable electrode separated from another electrode by an air gap and a dielectric layer.

Figure 9B:
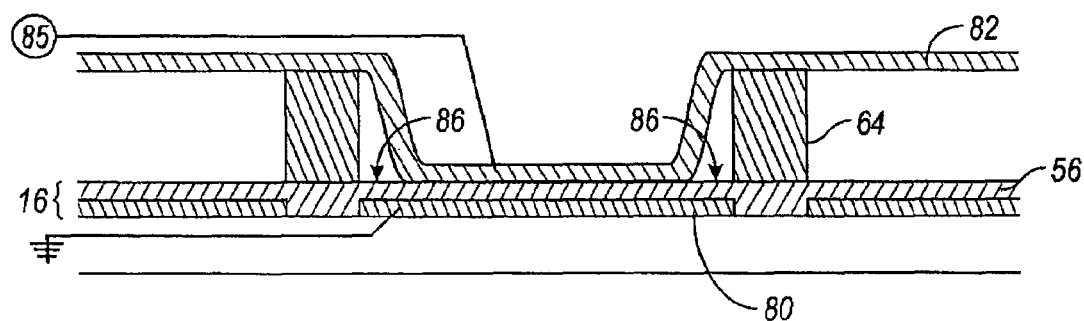
FIG. 9B is a cross-section of the MEMS device during a burn-in process in which the MEMS device is driven to an actuated state.

In FIG. 9B, a voltage is applied across to the first electrode 80 while the second electrode 82 is grounded, such that the second electrode deflects toward the first electrode 80, bringing a portion of the second electrode 82 into contact with the dielectric layer 56. The voltage is applied via a power source 85. In this embodiment, the applied voltage is then maintained for a period of time. The application of a sustained voltage serves to stabilize the charge accumulated within the dielectric layer 56, and to saturate the dielectric layer 56. While this stabilization and saturation is the result of the internal aging process of the dielectric layer 56, the sustained application of voltage across the dielectric layer 56 serves to accelerate this aging process, resulting in a MEMS device having initial performance which is more consistent than that of an unaged MEMS device.

Generally, MEMS devices such as interferometric modulators are fabricated in large arrays, comprising multiple row and column strip electrodes. This conditioning process may be performed simultaneously on each MEMS device in the array. In one embodiment, this may be done through the use of shorting structures which short each of the row electrodes or each of the column electrodes together, facilitating the application of voltage across each of the MEMS devices in the array. In one embodiment, these shorting structures comprise conductive leads deposited on portions of the substrate which will be scribed off at a later stage in the fabrication process. In another embodiment, the shorting structures comprise an external device utilized to make the desired connections between electrodes. Sustained application of voltage across each of the MEMS devices in the array will age the corresponding portions of the dielectric layer, providing more uniform performance across the array, as discussed above.

However, there are certain drawbacks to this conditioning method. For one, it can be seen in FIG. 9B that not every portion of the dielectric layer 56 comes into contact with the movable electrode 82 when the voltage is applied. Sections 86 of the dielectric layer 56 surrounding the support structure 64 do not come into contact with the movable electrode 82. Those portions 86 of the dielectric layer 56 are thus not aged as effectively as the portions of the dielectric layer 56 in contact with the movable second electrode 82.

In addition, as discussed briefly above, in an array addressable by row and column electrodes, in order to burn-in an individual MEMS element a sufficient voltage must be applied across the corresponding row and column electrodes. The fastest way to burn-in an entire array of MEMS devices, such as interferometric modulators, is to apply the same voltage across, for example each of the column electrodes while grounding the row electrodes, necessitating making a connection with each of these electrodes. This can be accomplished in a variety of ways, one of which is through the use of shorting structures discussed above, but it is desirable to simplify this process.

Figure 10:
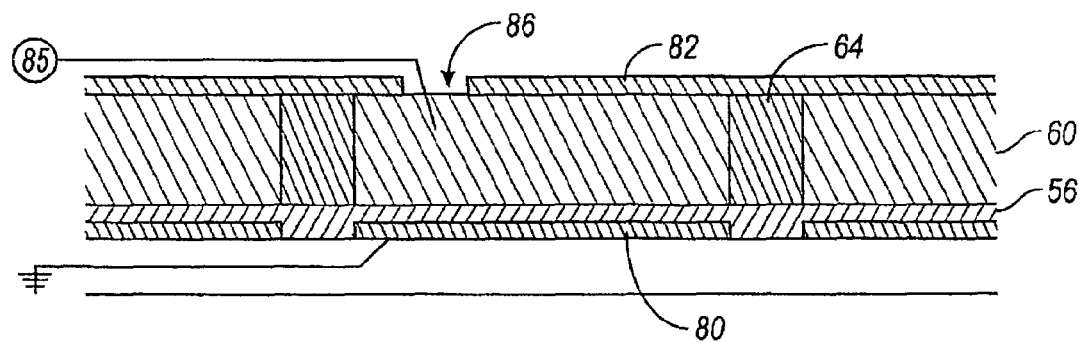
FIG. 10 is a cross-section of a partially fabricated MEMS device during a burn-in process in which a voltage is applied to a conductive sacrificial layer.

In an alternate embodiment, discussed with respect to FIG. 10, the burn-in process may advantageously be performed at an earlier stage in the fabrication process. FIG. 10 depicts a partially fabricated MEMS device, similar to the device of FIGS. 9A and 9B. The device comprises a substrate 20, a first electrode 80 located on the substrate, and a dielectric layer 56 located over the first electrode 80. A sacrificial layer 60 is located over the dielectric layer, and a second electrode 82 is located over the sacrificial layer 60, with support structures 64 extending from the underside of the first electrode 80 downward through the sacrificial layer 60. In the illustrated embodiment, an aperture 86 has been formed in the second electrode 82, exposing a portion of the sacrificial layer 60. In other embodiments, however, the aperture 86 may not be formed in the second electrode, and the voltage may be applied to a portion of the sacrificial layer extending beyond the second electrode, as discussed in greater detail below. In this embodiment, the sacrificial layer comprises a conductive material, such as molybdenum.

A voltage is then applied, via power source 85, to the conductive sacrificial layer 60 while the first electrode 80 is grounded. As can be seen, the conductive sacrificial layer 60 is in contact with underlying layers even in the area immediately surrounding the support structures 64, unlike the actuated second electrode 82 of FIG. 9B. The electrical power is thus more effectively applied to the entire dielectric layer 56 apart from the support regions, accelerating the aging process. In addition, in many embodiments, the conductive sacrificial layer 60 is more conductive than the second electrode 82, facilitating the burn-in process, particularly those in which the sacrificial layer 60 comprises molybdenum. In particular, in embodiments in which the MEMS device is an interferometric modulator, the portion of the second electrode 82 which comes into contact with the dielectric layer 56 may comprise a material which is selected for its reflective properties, rather than its conductive properties (e.g., the reflective layer 66 of FIG. 8D), such as chromium (Cr) or aluminum (Al).

The voltage is generally applied for a predetermined time. In one embodiment, the voltage is applied for at least about 5 minutes. In another embodiment, the voltage is applied for at least about 10 minutes. It will be understood that a desirable length of time for application of a voltage will depend on a variety of factors, including the composition and thickness of the various layers in the unreleased MEMS device, the structure of the MEMS device, the voltage applied, and environmental factors. In particular, the aging process is accelerated at higher temperatures.

Figure 11:
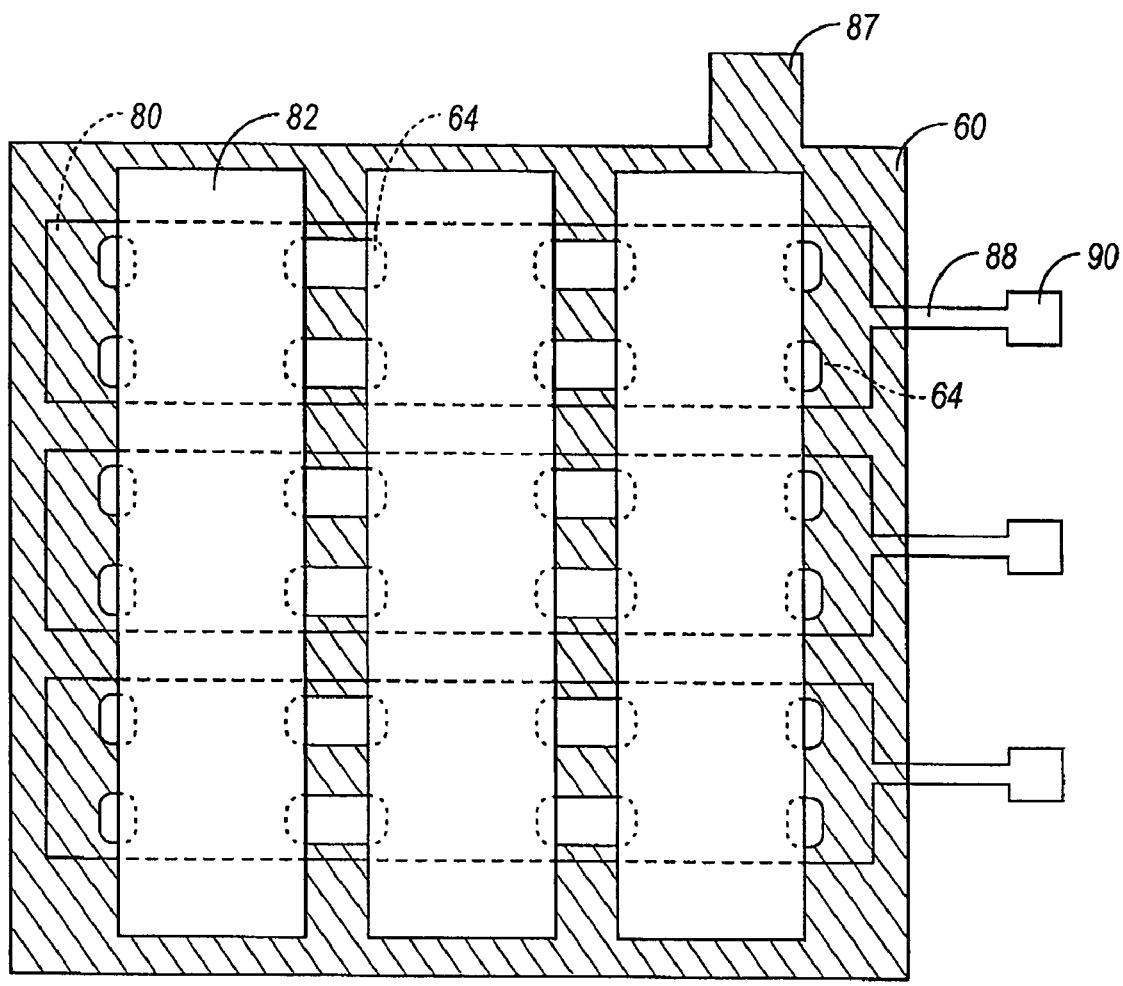
FIG. 11 is a top view of an array of partially fabricated MEMS devices such as the MEMS device of FIG. 10.

Advantageously, in certain embodiments, the sacrificial layer 60 is a single continuous layer which extends throughout the entire array of partially fabricated MEMS devices, as will be discussed below with respect to FIG. 11. Thus, application of voltage to a single portion of the conductive sacrificial layer 60 will enable aging of the dielectric layer 56 in each of the MEMS elements in the array. Application of voltage to the sacrificial layer 60, rather than the upper electrodes 82, advantageously eliminates the need for a shorting structure connecting the upper electrodes 82 to each other, as discussed above, simplifying the burn-in process.

In certain embodiments, the second electrode 82 may be patterned and etched to form the aperture 86 which permits application of the voltage directly to the sacrificial layer 60. However, in order to ensure even burn-in of the MEMS devices, it may be desirable to apply the voltage at more than one location on the sacrificial area. In certain embodiments, the sacrificial layer may be patterned prior to the deposition of the second electrode layer, enabling the formation of structures such as contact area 87, which is a portion of the underlying sacrificial layer 60 extending beyond the second electrodes 82. FIG. 11 depicts an overhead view of a simplified version of such an array. As can also be seen in FIG. 11, despite the presence of support structures 64 throughout the array, the sacrificial layer 60 comprises a contiguous layer which extends throughout the MEMS array, such that application of a voltage to the sacrificial layer 60 at a single point or at a small number of points may be effective, simplifying the burn-in process. In further embodiments, multiple contact areas 87 may be formed, enabling the application of voltages at multiple locations. In other embodiments, these contact areas 87 may comprise a variety of shapes, and be formed in a variety of locations, such as a wide contact area connected to the remainder of the sacrificial layer via a thinner lead. In yet other embodiments, the periphery of the sacrificial layer 60 may be left substantially unetched, such that it extends beyond the second electrodes 82 (as can be also seen in FIG. 11), and voltage may be applied at any location outside of the second electrodes 82. In various embodiments, the voltage may be applied via an aperture (not shown) in the overlying layers, such as aperture 86 of FIG. 10.

The first electrode layer 80 is generally covered by the dielectric layer 56 throughout the MEMS array. In order to make an electrical connection with the first electrode layer 80, extensions of the first electrode layer 80 can be patterned and etched to form conductive leads 88 which extend at least partially beyond the array and the dielectric layer, as can be seen in FIG. 11. These conductive leads 88 may comprise or connect to contact points 90, which in certain embodiments may comprise contact pads or conductive bumps. In certain embodiments, these conductive leads may be temporarily shorted together, such as through the use of a shorting structure as discussed above, and then used to communicate with the various strip electrodes in the finished device.

Defects in the dielectric layer of a MEMS device of the type discussed above may result in a leakage current or a short when a voltage is applied between the first and second electrodes to actuate the movable electrode. In addition to the burn-in process, the MEMS device or array may be also be tested at this point in the fabrication process, in order to identify devices in which the dielectric layer is defective or provides insufficient insulation in some way. In some embodiments, this testing comprises measuring the resistance across the MEMS device or array, which may be done either during the burn-in process or in a separate process. While the sacrificial layer and the underlying electrode will contribute some resistance, the resistance measurement will be dominated by the resistance of the dielectric layer. If the measured resistance differs from the expected resistance by a significant amount, the MEMS device or array may be identified as potentially defective. By testing the unreleased MEMS device or array, defects in those portions of the dielectric layer surrounding the support structures may be more easily identified than by testing a released MEMS device or array (e.g., FIGS. 8F and 9A), at which point the movable layer may not come into contact with those portions of the dielectric layer.

In one embodiment, in which an array of unreleased interferometric modulators (e.g. FIGS. 8E and 10) is being aged as discussed above, the expected resistance may be roughly 10 $M\Omega$. In a particular embodiment, if the measured resistance when voltage is applied to the conductive sacrificial layer is less than about 100 $k\Omega$, the array of interferometric modulators is identified as potentially defective. In another embodiment, if the measured resistance is less than about 10 $k\Omega$, the array of interferometric modulators is identified as potentially defective. In another embodiment, if the measured resistance across an unreleased MEMS device is less than the expected resistance by at least about 2 orders of magnitude, the MEMS device is identified as potentially defective.

It will be understood that various combinations of the above embodiments are possible. For instance, in embodiments in which the voltage is applied directly to the sacrificial layer, the voltage may be applied prior to the deposition of one or all of the layers overlying the sacrificial material, eliminating the need to etch any apertures in the overlying layers for the purposes of applying a voltage. In another embodiment, the voltage across the sacrificial layer and the first electrode may be applied in another way, such as by grounding the sacrificial layer and applying the voltage to the strip electrode. Various other combinations of the methods and devices discussed above are contemplated. In addition, it will be understood that the methods of forming and testing MEMS devices discussed above may be utilized in combination with other methods of forming and testing MEMS devices, in order to improve the performance of those MEMS devices.

It will also be recognized that the order of layers and the materials forming those layers in the above embodiments are merely exemplary. Moreover, in some embodiments, other layers, not shown, may be deposited and processed to form portions of a MEMS device or to form other structures on the substrate. In other embodiments, these layers may be formed using alternative deposition, patterning, and etching materials and processes, may be deposited in a different order, or composed of different materials, as would be known to one of skill in the art.

It is also to be recognized that, depending on the embodiment, the acts or events of any methods described herein can be performed in other sequences, may be added, merged, or left out altogether (e.g., not all acts or events are necessary for the practice of the methods), unless the text specifically and clearly states otherwise.

While the above detailed description has shown, described, and pointed out novel features of the invention as applied to various embodiments, it will be understood the various omissions, substitutions, and changes in the form and details of the device of process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of making a MEMS device, comprising:
   forming a first electrode layer;
   forming a dielectric layer over the first electrode layer;
   depositing a layer of sacrificial material over the dielectric layer, wherein the layer of sacrificial material is conductive, and wherein the layer of sacrificial material is in electrical communication with the dielectric layer; and
   applying a voltage to said layer of sacrificial material.

2. The method of claim 1, additionally comprising forming a second electrode layer over said layer of sacrificial material.

3. The method of claim 2, additionally comprising patterning said second electrode layer to expose at least one portion of the layer of sacrificial material, wherein the voltage is applied to said at least one exposed portion.

4. The method of claim 3, wherein patterning said second electrode layer comprises forming an aperture in said second electrode layer.

5. The method of claim 3, additionally comprising patterning said layer of sacrificial material to form a contact area, wherein the voltage is applied to said contact area.

6. The method of claim 2, additionally comprising forming a partially reflective layer between the first electrode layer and the dielectric layer.

7. The method of claim 2, wherein forming the second electrode layer comprises forming a reflective layer adjacent the layer of sacrificial material.

8. The method of claim 7, wherein forming the second electrode layer comprises forming a deformable layer above the layer of sacrificial material.

9. The method of claim 1, wherein the voltage is applied for a period of time sufficient to stabilize the charge in the dielectric layer.

10. The method of claim 1, wherein the voltage is applied for at least about 5 minutes.

11. The method of claim 1, wherein the voltage is applied for at least about 10 minutes.

12. The method of claim 1, additionally comprising forming at least one conductive lead in electrical communication with the first electrode layer, wherein the voltage is applied to said at least one conductive lead.

13. The method of claim 1, wherein the dielectric layer comprises silicon oxide.

14. The method of claim 1, wherein the dielectric layer comprises silicon nitride.

15. The method of claim 1, wherein the layer of sacrificial material comprises molybdenum.

16. A method of fabricating a MEMS device, comprising:
    providing a first electrode layer;

providing a dielectric layer located over the first electrode layer;

providing a conductive sacrificial layer located over the dielectric layer;

providing a second electrode layer located over the conductive sacrificial layer;

applying a voltage to the conductive sacrificial layer for a period of time; and etching the conductive sacrificial material to define a cavity.

17. The method of claim 16, further comprising providing a partially reflective layer located between the first electrode layer and the dielectric layer, and wherein the second electrode layer comprises a reflective layer.

18. The method of claim 16, wherein the conductive sacrificial layer comprises molybdenum.

19. The method of claim 16, wherein etching the conductive sacrificial comprises a $XeF_2$ etch.

20. The method of claim 16, wherein the dielectric layer comprises at least one of silicon oxide and silicon nitride.

* * * * *